United States Patent [19]
Bohr

[11] Patent Number: 6,124,191
[45] Date of Patent: Sep. 26, 2000

[54] SELF-ALIGNED CONTACT PROCESS USING LOW DENSITY/LOW K DIELECTRIC

[75] Inventor: Mark T. Bohr, Aloha, Oreg.

[73] Assignee: Intel Corporation, Santa Clara, Calif.

[21] Appl. No.: 09/002,196

[22] Filed: Dec. 31, 1997

[51] Int. Cl.⁷ ............................................ H01L 21/4763
[52] U.S. Cl. .......................... 438/595; 438/780; 438/303
[58] Field of Search .................................. 438/265, 287, 438/303, 409, 494, 523, 533, 586, 591, 595, 634, 725, 780

[56] References Cited

U.S. PATENT DOCUMENTS

| | | | |
|---|---|---|---|
| 5,627,082 | 5/1997 | Beratan et al. | 438/55 |
| 5,923,988 | 7/1999 | Cheng et al. | 438/305 |
| 5,929,441 | 7/1999 | Beratan et al. | 250/332 |
| 5,930,627 | 7/1999 | Zhou et al. | 438/257 |

OTHER PUBLICATIONS

"Integration of Perfluorocyclobutane (PFCB)", by C.B. Case, C.J. Case, A. Kornblit, M.E. Mills, D. Castillo, R. Liu, Conference Proceedings, ULSI XII© 1997, Materials Research Society pp. 449–454.

"Nanoporous Silica for Dielectric Constant Less than 2", by Ramos, Roderick, Maskara and Smith, Conference Proceedings ULSI XII© 1997, Materials Research Society pp. 455–461.

"Porous Xerogel Films as Ultra–Low Permittivity Dielectrics for ULSI Interconnect Applications", by Jin, List, Lee, Lee, Luttmer and Havermann, Conference Proceedings ULSI XII© 1997, Materials Research Society pp. 463–469.

*Primary Examiner*—Tuan H. Nguyen
*Assistant Examiner*—Jack Chen
*Attorney, Agent, or Firm*—Blakely, Sokoloff, Taylor & Zafman LLP

[57] ABSTRACT

Method and apparatus for fabricating contacts to substrate regions through a low k, low density dielectric. A cap is formed over gates and side spacers are formed along the edges of the gates so as to surround the gates in a relatively dense (e.g., silicon dioxide) insulative material. A low k or low density layer of a polymer or silica aerogel or xerogel material is formed in contact with the substrate covering the gate structures including the spacers. An unlanded contact opening is etched through the low k, low density dielectric with an etchant that provides high selectivity between the insulation surrounding the gate and the low k, low density layer.

4 Claims, 3 Drawing Sheets

SELF-ALIGNED CONTACT PROCESS USING LOW DENSITY/LOW K DIELECTRIC

RELATED APPLICATIONS

This application is related to co-pending applications Ser. No. 829,054, filed Apr. 28, 1997, entitled "A Method to Fabricate Unlanded Vias with a Low Dielectric Constant Material as an Intraline Dielectric"; and Ser. No. 829,112, filed Mar. 31, 1997, entitled "A Novel Damascene Interconnect Structure to Achieve Unlanded Vias for Low k Materials"; both assigned to the Assignee of the present application.

BACKGROUND OF THE INVENTION

1. Field of the Invention

The invention relates to the field of integrated circuit, metal-oxide-semiconductor (MOS) transistors and in particular to the fabrication of electrical contacts to substrate regions.

2. Prior Art

There has been much discussion about using materials having low dielectric constants (e.g., less than 4) and materials having low density for interlayer dielectrics (ILDs) in integrated circuits. By lowering the capacitance between conductors separated by the ILDs, power reduction and speed increases are both possible.

As will be seen with the present invention, a low k material or a low density dielectric can be used to provide additional benefits in connection with the fabrication of contacts to the substrate.

In the cross sectional elevation view of FIG. 1, the silicon substrate 10 includes source/drain regions 11 and 12 formed in the substrate 10 which define a channel. A polysilicon gate 13 is insulated from this channel by a insulative layer such as a silicon dioxide layer 14. FIG. 1 also illustrates an isolation region 15, specifically a silicon dioxide filled trench which is commonly used to separate active regions of field-effect transistors. An overlying insulative layer 17 is typically deposited over the structure of FIG. 1 and, in subsequent processing, an opening 16 is etched through the layer 17 to enable a metal contact to contact, for instance, the region 12. Numerous steps and structures often used such as spacers for aligning lightly doped source/drain regions and protective oxides used during the fabrication to protect for example the gate 13, are not illustrated.

As can be seen in FIG. 1, the region 12 is relatively elongated. This is done so that when the contact opening 16 is etched through the layer 17, it lands on the region 12. This is important since if the contact opening were to expose the gate 13, when the contact is formed the gate 13 and region 12 would be connected "shorting" the transistor. Note that the opening 16 is not self-aligned in that the mask used to define the opening (and the other such openings in the layer 17) must be aligned by moving the mask itself relative to the substrate. The mask must be aligned so that the opening is exactly over the targeted regions and not, for instance, over the gate 13 or the region 15. Consequently, the region 12 is elongated to provide compensation for masking alignment tolerances. This increases the amount of substrate area required for the transistor and hence, reduces circuit density and increases junction capacitance.

FIG. 2 shows another prior art technique for providing contact to the substrate 20. In the cross-sectional elevation view of FIG. 2, the source/drain regions 21 and 22 define a channel which is insulated from the gate 23 by the insulative layer. In connection with the formation of the gate 23 a relatively thick silicon nitride cap 29 is formed over the gate 23. Additionally, a silicon nitride layer 28 is deposited over the substrate and as can be seen, protects the sides of the gate 23. A insulative layer 27 such as silicon dioxide layer, is deposited over the layer 28.

The opening 26 is etched to contact the region 22. Unlike the opening 16 of FIG. 1, opening 26 need not be precisely aligned over region 22. That is, the opening 26 can be "unlanded" and can, in fact, in part expose the relatively thick silicon nitride cap over the gate 23 or the thinner nitride layer 28 deposited over the isolation region 25.

In etching the opening 26, a first etchant is used which more readily etches the material of layer 27 than silicon nitride. Consequently, the silicon nitride acts as an etchant stop, allowing the layer 27 to be etched without the gate 23 becoming exposed even though the opening is not entirely over the region 22. Then a second etchant is used, for instance in an anisotropic etching step, to etch the silicon nitride, thereby exposing the region 22. The relatively thicker cap 29 over the gate 23 prevents the gate from being exposed. Moreover, the anisotropic etching spares most of layer 28 that is vertically aligned on the side of gate 23. When a contact is formed in the opening 26, it only makes a conductive path to the region 22 because the gate is protected by the silicon nitride. Note that as shown in FIG. 2, the region 22 need not be large enough for the opening land solely on the targeted region. Accordingly, region 22 may be smaller than region 62 of FIG. 1, thereby permitting fabrication of denser circuits.

The unlanded contact shown in FIG. 2 is difficult to reliably achieve. It is difficult to obtain high enough etchant selectivity between the layer 27 and the layer 28. Typical selectivity of 5-to-1 is achievable and this is not high enough for reliable manufacturing. Moreover, the process of FIG. 2, when compared to the processing of FIG. 1, requires additional steps such as depositing the etchant stop layer 28.

SUMMARY OF THE INVENTION

An improvement in the fabrication of an MOS transistor on a silicon substrate is described. After a gate is formed at least one side and the upper surface of the gate is insulated with an insulation which includes a first dielectric material. The first dielectric material is covered with a layer of a dielectric layer. An opening is etched to the substrate through the second layer with an etchant that etches the second dielectric material at a rate at least 10 times faster than the etchant etches the first dielectric material.

DETAILED DESCRIPTION OF THE PRESENT INVENTION

A method and apparatus is disclosed for an unlanded contact to a substrate for use in an MOS field-effect transistor. In the following description, numerous specific details are set forth such as specific materials, in order to provide a thorough understanding of the present invention. It will be apparent, however, that the present invention may be practiced without these specific details. In other instances, well-known steps such as doping steps used to form the source and drain regions of field-effect transistors are not described in detail in order not to obscure the present invention.

Figure 1:
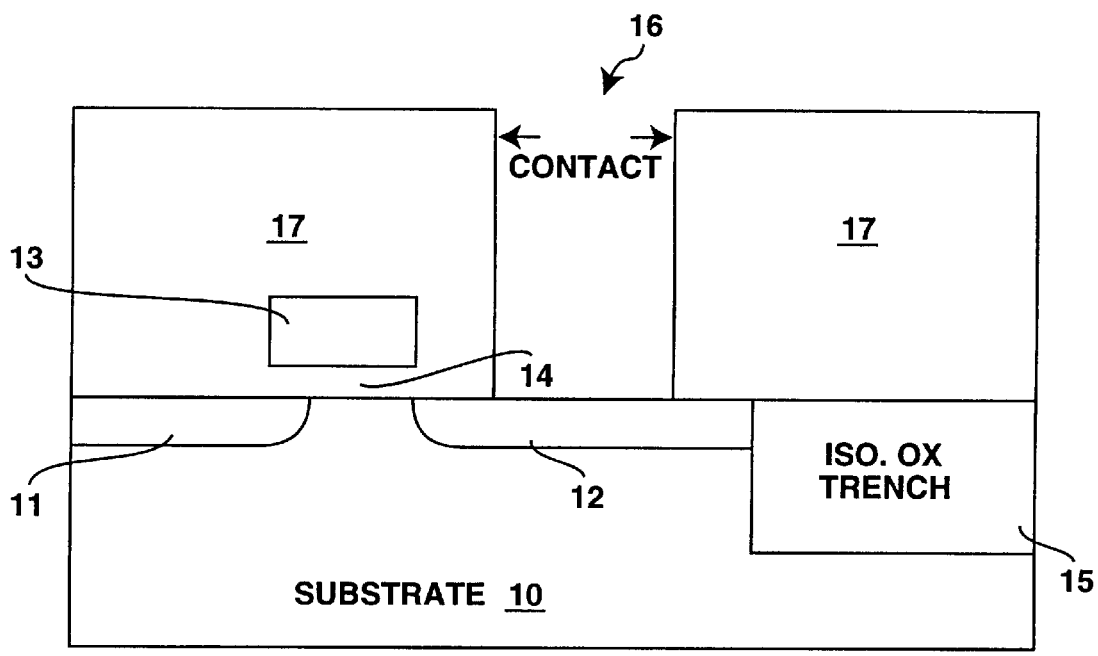
FIG. 1 is a cross-sectional elevation view of a substrate illustrating a prior art contact.
Figure 2:
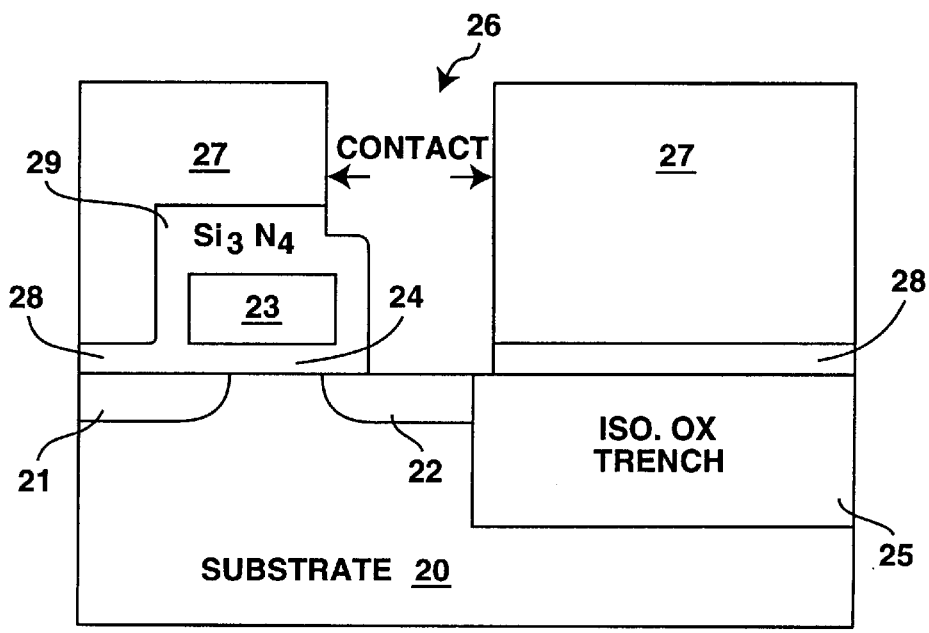
FIG. 2 is a cross-sectional elevation view of a substrate illustrating another prior art contact.
Figure 3:
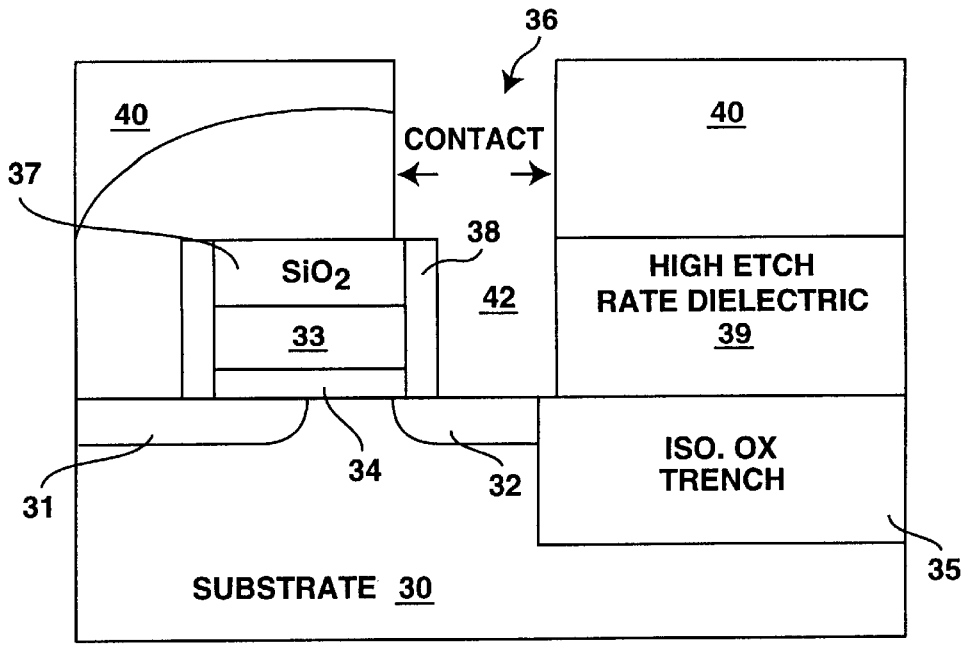
FIG. 3 is a cross-sectional elevation view of a substrate illustrating a contact in accordance with the present invention.

In the cross-sectional elevation view of FIG. 3, a contact 42 is illustrated in an opening 36 which contacts the doped region 32 of the substrate 30. As will be seen from FIGS. 4–7, the unlanded contact 42 is achievable with the present invention in part through use of low k and/or low density dielectric materials with etch rates much higher than silicon dioxide and silicon nitride.

Figure 4:
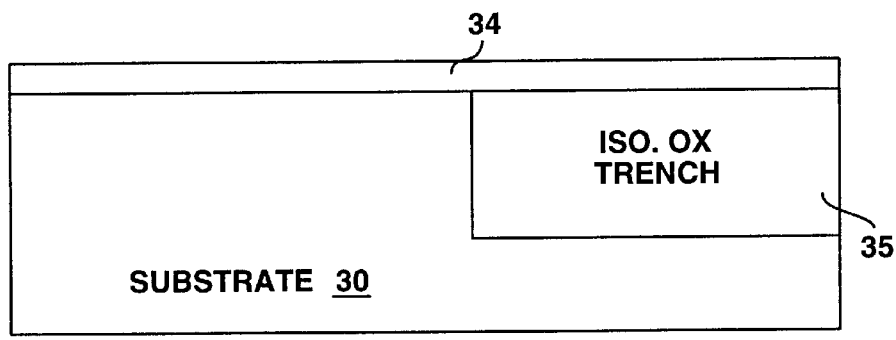
FIG. 4 is a cross-sectional elevation view of a substrate which includes an isolation trench and insulative layer formed on the substrate.

An ordinary monocrystalline silicon substrate 30 is shown in the cross-sectional elevation view of FIG. 4. Ordinary processing is used to form isolation regions such as a silicon dioxide filled trench 35. Other well-known processing steps may also be used, for example, to form p-type and/or n-type wells in the substrate in which complementary MOS transistors are fabricated. In FIG. 4 a gate insulative layer 34 is shown which may be an ordinary layer such as a thermally grown silicon dioxide layer.

A polycrystalline silicon layer is deposited onto the gate oxide layer 34 and in one embodiment of the present invention, a silicon dioxide layer is deposited over the polycrystalline silicon layer using chemical vapor deposition (CVD). The silicon dioxide or silicon nitride layer may be, for instance, 1500 to 2000 Å thick. Through use of ordinary photolithographic techniques, the silicon dioxide layer and the underlying polycrystalline silicon layer and gate oxide layer 34 are etched to define the gate structure shown in FIG. 5. More specifically, the polysilicon gate 33 is shown insulated from the substrate 30 by the gate oxide layer 34 with a silicon dioxide cap 37 overlying the upper surface of the gate 33.

Typically in the formation of an MOS transistor, after the gate is defined, lightly doped regions in alignment with the gate are formed so that there are more lightly doped source and drain regions directly underlying the edges of the gate. These regions are not shown in FIG. 5. Additionally, well-known numerous cleaning steps and the deposition or growth of protective silicon dioxide layers often used in the prior art are not discussed or illustrated.

Figure 5:
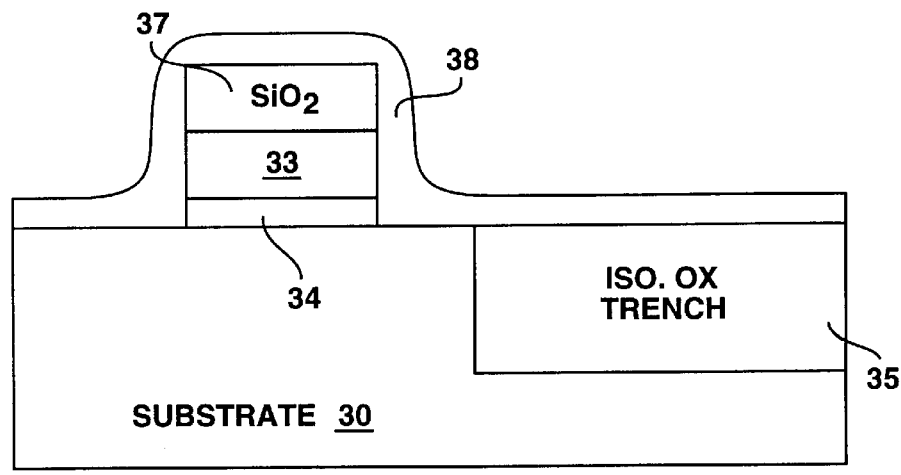
FIG. 5 illustrates the substrate of FIG. 4 after a gate and overlying insulative layer of a first dielectric material have been formed over the substrate.
Figure 6:
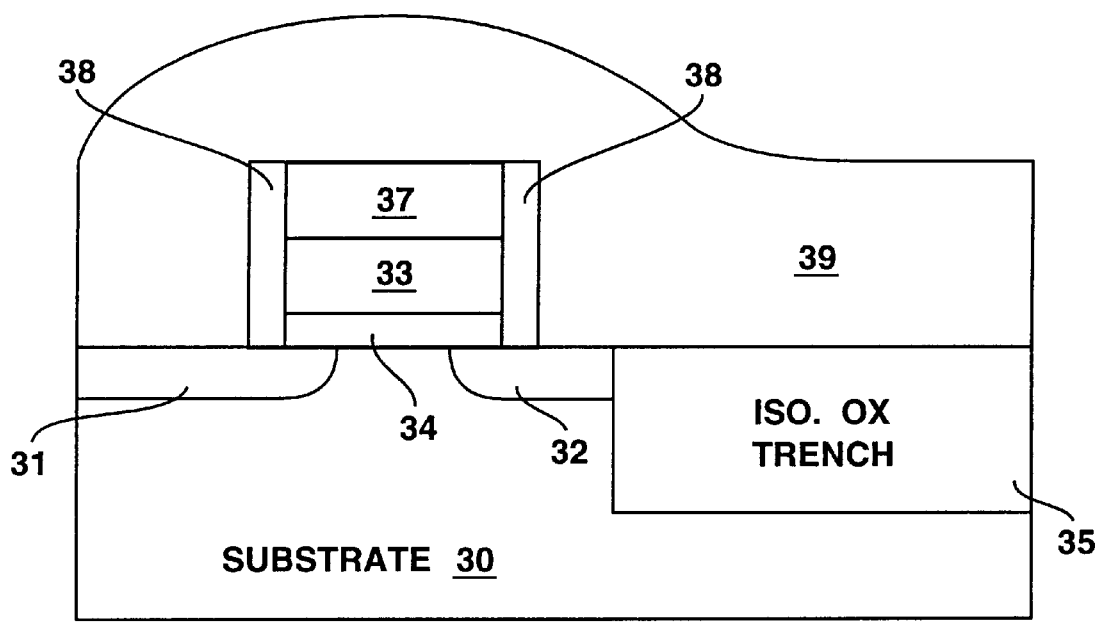
FIG. 6 illustrates the substrate of FIG. 5 after spacers have been etched from the first dielectric material and after another insulative layer of a second dielectric material has been deposited over the substrate.

Following the definition of the gate structure of FIG. 5 and the lightly doping of the source and drain regions, as mentioned above, a conformal silicon dioxide layer 38 such as a CVD layer is deposited over the substrate. An anisotropic etching step is now used to etch the layer 38 so as to form spacers on opposite sides of the gate structure as is well-known. These are shown in FIG. 6 as spacers 38 formed from the layer 38. The spacers may be fabricated from other materials such as silicon nitride.

Typically at this point in the processing the main source and drain regions are doped for both the p-channel and n-channel transistors by for instance, ion implanting dopant in alignment with the spacers. Source/drain regions 31 and 32 are shown in FIG. 6. The conductivity type of these regions, of course, will depend on whether an n-channel or p-channel transistor is being fabricated. For purposes of the present invention, the conductivity type of the transistor is of no consequence.

Now a low k and/or low density insulative layer 39, for instance 3000–5000 Å thick, is formed over the substrate including the gate structure and spacers 38. Several dielectric materials may be used for layer 39. One category of materials that may be used are organic polymers which are typically spun-on and which exhibit a low dielectric constant. A discussion of perfluorocyclobutane (PFCB) organic polymers is described in "Integration of Perfluorocyclobutane (PFCB)", by C. B. Case, C. J. Case, A. Kornblit, M. E. Mills, D. Castillo, R. Liu, *Conference Proceedings, ULSI XII© 1997, Materials Research Society,* beginning at page 449. These polymers are available from companies such as Dupont, Allied Signal, Dow Chemical, Dow Corning, and others.

Another category of materials that may be used in the present invention are silica-based such as the nanoporous silica aerogel and xerogel. These dielectrics are discussed in "Nanoporous Silica for Dielectric Constant Less than 2", by Ramos, Roderick, Maskara and Smith, *Conference Proceedings ULSI XII© 1997, Materials Research Society,* beginning at page 455 and "Porous Xerogel Films as Ultra-Low Permittivity Dielectrics for ULSI Interconnect Applications", by Jin, List, Lee, Lee, Luttmer and Havermann, *Conference Proceedings ULSI XII© 1997, Materials Research Society,* beginning at page 463.

It should be noted that in the present invention, the low k and/or low density dielectric layer 39 is formed directly on the substrate and is, in effect, the so-called zero level ILD. Typically the low k, low density dielectrics are used in the higher level ILDs.

Figure 7:
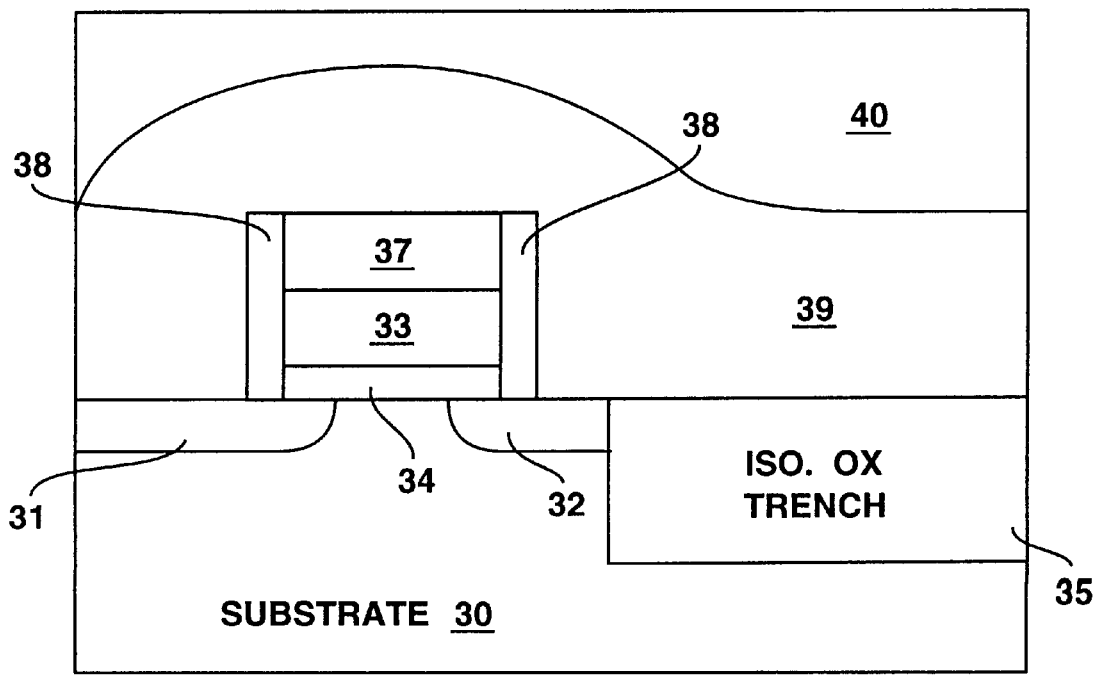
FIG. 7 illustrates the substrate of FIG. 6 after planarization of an additional insulative layer.

In one embodiment of the present invention, another layer of insulation 40, of harder material when compared to layer 39, such as a silicon dioxide layer, is formed over layer 39. This layer is planarized generally using chemical-mechanical polishing as shown in FIG. 7 by layer 40. When the layer 40 is used and an opening is formed through this layer, it may be advisable to have the layer 39 act as an etchant stop while etching through the layer 40. To this end, where silicon dioxide is used for layer 40, a polymer may be used for layer 39 rather than a porous silicon dioxide.

Next, using ordinary photolithographic techniques, an opening is etched through layers 40 and 39 to expose the region 42 as shown in FIG. 3 by opening 36. Note, as this is an unlanded contact opening, the region 32 need not be elongated. In the formation of the opening 36, particularly for etching the layer 39, an etchant is used that etches through the dielectric material for layer 39 at a rate much higher than the etchant etches the material used for the cap 37 and the spacers 38 and oxide isolation region 35. Numerous well-known etchants may be used that provide a selectivity of at least 20 to 1 between the dielectric materials discussed above for layer 39 and a typical CVD deposited silicon dioxide such as may be used for cap 37 and spacers 38. Among the etchants that may be used are oxygen for polymer based materials and fluorine based chemistry for silicon dioxide. Generally, if the etchants provide a selectivity of at least 10 to 1, between the etchant rate of the material forming the dielectric layer 39 and the rate at which the etchant etches the spacers and cap, satisfactory results are achieved.

The opening 36 is filled with a conductive material such as tungsten to form a plug or contact 42 making electrical contact with the substrate region 32.

Thus, with the present invention an unlanded contact is realized with a reliable process with the added advantage of having low k and/or low density dielectric materials for the zero level ILD.

I claim:

1. A process for forming a MOS transistor on a silicon substrate, comprising:

forming a gate;

insulating an upper surface of the gate with an insulator which includes a first dielectric material;

covering the substrate with a layer of silicon dioxide;

anisotropically etching the silicon dioxide to form sidewall spacers on the gate;

depositing a layer of perfluorocyclobutane (PFCB) organic polymer over the substrate;

etching an opening to the substrate through the layer of PFCB organic polymer with an etchant that etches the layer of PFCB organic polymer at a rate at least 10 times faster than the etchant etches the layer of silicon dioxide and the first dielectric material, wherein portions of the spacers and the first dielectric material are exposed during the step of etching.

2. The process defined by claim 1 including forming an additional insulative layer over the layer of PFCB organic polymer and then planarizing the additional insulative layer with chemical-mechanical polishing.

3. The process for forming an MOS transistor comprising:

forming a gate, having a lower surface insulated from a substrate and an upper surface cover with a cap formed from a first dielectric material;

forming spacers on sides of the gate from silicon dioxide;

covering the substrate including the cap and spacers with a layer of nanoporous silica based dielectric which contacts the substrate adjacent to the spacers;

etching an-opening to contact the substrate through the nanoporous silica based dielectric with an etchant that etches the nanoporous silica based dielectric at least 10 times faster than the silicon dioxide, wherein portions of the spacers and the caps are exposed during the step of etching.

4. The process defined by claim 3 including forming a dielectric layer over the nanoporous silica based dielectric prior to the etching step and then chemically-mechanically polishing the dielectric layer prior to the etching step.

* * * * *